United States Patent
Araki

(10) Patent No.: US 7,514,712 B2
(45) Date of Patent: Apr. 7, 2009

(54) ELECTRO-OPTIC DISPLAY AND CONNECTION BETWEEN DRAIN ELECTRODE AND PIXEL ELECTRODE

(75) Inventor: Toshio Araki, Kumamoto (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 100 days.

(21) Appl. No.: 11/349,146

(22) Filed: Feb. 8, 2006

(65) Prior Publication Data

US 2006/0289866 A1   Dec. 28, 2006

(30) Foreign Application Priority Data

Jun. 24, 2005   (JP) ............... 2005-184408

(51) Int. Cl.
*H01L 29/04* (2006.01)
*H01L 29/10* (2006.01)
*H01L 31/00* (2006.01)

(52) U.S. Cl. .................... 257/59; 257/72; 257/E29.273

(58) Field of Classification Search ............ 257/57–61, 257/72, 347, E29.237, E19.273
See application file for complete search history.

(56) References Cited

U.S. PATENT DOCUMENTS

| | | | | |
|---|---|---|---|---|
| 6,115,090 A | * | 9/2000 | Yamazaki | 349/42 |
| 2001/0019375 A1 | * | 9/2001 | Kwon et al. | 349/43 |
| 2005/0024549 A1 | * | 2/2005 | Gotoh et al. | 349/43 |

FOREIGN PATENT DOCUMENTS

| | | |
|---|---|---|
| JP | 9-22897 | 1/1997 |
| JP | 10-170951 | 6/1998 |
| JP | 2004-233683 | 8/2004 |
| JP | 2005-24940 | 1/2005 |
| JP | 2005024940 A * | 1/2005 |
| KR | 2001-0082837 | 8/2001 |
| KR | 10-2005-0054345 | 6/2005 |

OTHER PUBLICATIONS

Machine translation of Detailed Description of JP-2005024940A, 6 pages.*

* cited by examiner

*Primary Examiner*—Kimberly D Nguyen
*Assistant Examiner*—Alexander Belousov
(74) *Attorney, Agent, or Firm*—Oblon, Spivak, McClelland, Maier & Neustadt, P.C.

(57) ABSTRACT

A pixel electrode is disposed to cover the inner surfaces of a pixel-drain contact hole passing through a third insulating film and a second insulating film to reach a drain electrode. At the bottom of the pixel-drain contact hole, the pixel electrode is electrically connected with the drain electrode through a contact conductor film. The pixel-drain contact hole is formed of a connection of a contact hole passing through the second insulating film and a contact hole passing through the third insulating film. The dimensions of the opening end of the contact hole are larger than its dimensions at the bottom, and thus the inner surfaces of the contact hole are smoothly sloped and shaped like a crater in cross section.

4 Claims, 10 Drawing Sheets

ELECTRO-OPTIC DISPLAY AND CONNECTION BETWEEN DRAIN ELECTRODE AND PIXEL ELECTRODE

BACKGROUND OF THE INVENTION

1. Field of the Invention

The present invention relates to electro-optic displays and manufacturing methods thereof, and particularly to an active-matrix electro-optic display having thin film transistors (TFTs) as switching elements, and to a manufacturing method thereof.

2. Description of the Background Art

As electro-optic displays using liquid crystal or organic-electroluminescence (EL) as electro-optic elements, active-matrix TFT-array substrates (active-matrix substrates) are widely used in which an array of switching elements, such as thin film transistors, is formed on the substrate and an independent video signal is applied to each display pixel.

In such an electro-optic display, it is important to make the display area of each pixel as large as possible, or to use a substrate with a high aperture ratio, in order to obtain bright and high display quality.

Japanese Patent Application Laid-Open No. 10-170951 (see FIGS. 1 and 2, hereinafter referred to as Patent Document 1) discloses a common structure of such an active-matrix substrate with a high aperture ratio.

In the active-matrix substrate disclosed in the Patent Document 1, gate signal lines, gate insulating film, semiconductor film, and source and drain electrodes electrically connected to the semiconductor film are sequentially formed to fabricate TFTs on a transparent insulative substrate, e.g., glass. Then, the entire substrate including the TFTs is covered with an inorganic insulating film and further with an organic interlayer insulating film, which is followed by planarization. This structure allows the pattern of pixel electrodes to be overlapped with signal lines. This enhances the aperture ratio of the liquid crystal display and makes it possible to shield electric fields caused by signal lines.

In the active-matrix substrate disclosed in the Patent Document 1, a contact hole for electrically connecting the pixel electrode and the drain electrode of the TFT located under the pixel electrode is formed by etching the inorganic insulating film using the organic interlayer insulating film as a mask.

In this case, the edges of the inorganic insulating film that define the bottom of the contact hole are located in a position further inside in the plane direction than the edges of the organic interlayer insulating film existing thereon, and then the organic interlayer insulating film may project like eaves beyond the inorganic insulating film.

This phenomenon occurs because the inorganic insulating film is somewhat over-etched so that the drain electrode is exposed in the bottom of the contact hole. Then, the pixel electrode cannot cover the eave-like portions at the bottom of the contact hole, which results in disconnection.

Also, in a liquid crystal display, electrically connecting an upper electrode and a lower electrode through a contact hole passing through an interlayer insulating film may encounter another problem as described in Japanese Patent Application Laid-Open No. 2004-233683 (see FIG. 12(b): hereinafter referred to as Patent Document 2).

That is, according to the Patent Document 2, when the pixel electrode is made of transparent material such as ITO (Indium Tin Oxide) or IZO (Indium Zinc Oxide), the pixel electrode is prone to crack and disconnect on the organic interlayer insulating film at the peripheral edges of the contact hole.

In order to solve this problem, Patent Document 2 discloses a partially two-layered structure in which first and second pixel electrodes are stacked in the contact hole and its vicinity.

The inventors of the present invention examined the above-described problems of conventional liquid crystal displays and found that the formation of cracks on the organic interlayer insulating film at the peripheral edges of the contact hole can be avoided by gently tapering the peripheral edges of the contact hole or by forming at least the first pixel electrode not with oxide such as ITO and IZO but with ductile metal, for example.

Even when the first pixel electrode is made of a film of opaque metal, no problem arises with light transmission in the pixel area when the second pixel electrode is made of transparent material, because the first pixel electrode is disposed only in the contact hole and its vicinity.

However, it has been found that, when the first pixel electrode as the lower layer of the partially two-layered pixel electrode is made of a metal film, the edges of the metal film are likely to be reversely tapered in cross section, and then the overlying second pixel electrode may be disconnected in the reversely tapered portion.

The metal film is reversely tapered in cross section because the metal film is etched by etching liquid penetrating the interface between the metal film and the underlying organic interlayer insulating film.

SUMMARY OF THE INVENTION

An object of the present invention is to provide an electro-optic display and its manufacturing method which prevent point defects caused by disconnection between overlying pixel electrodes and underlying TFT drain electrodes.

According to the present invention, an electro-optic display includes an active-matrix substrate having an insulative substrate and a plurality of display pixels arranged in a matrix on the insulative substrate and each having a pixel electrode electrically connected with a thin film transistor, wherein, in each of the display pixels, the active-matrix substrate further includes: an inorganic insulating film that entirely covers an upper surface of the insulative substrate including a drain electrode of the thin film transistor; an organic resin insulating film that entirely covers an upper surface of the inorganic insulating film; a pixel-drain contact hole that passes through the inorganic insulating film and the organic resin insulating film to reach the drain electrode; and a contact conductor film that is provided at the bottom of the pixel-drain contact hole and is in contact with the drain electrode, and the pixel electrode is disposed to cover an upper surface of the organic resin insulating film and also to cover an inner wall of the pixel-drain contact hole and the contact conductor film.

According to the electro-optic display, the contact conductor film is in contact with the drain electrode at the bottom of the pixel-drain contact hole, and the pixel electrode covers the organic resin insulating film and also covers the inner walls of the pixel-drain contact hole and the contact conductor film. Accordingly, when the contact conductor film is made of a thin film of metal having higher ductility than transparent conductive film material such as ITO, for example, it is possible to prevent the contact conductor film from cracking so as to prevent point defects caused by disconnection between the pixel electrode and the underlying TFT drain electrode. Also, electrically connecting the pixel electrode and the drain electrode through the contact conductor film reduces the resistance of connection and provides an electro-optic display of high display quality. Furthermore, the contact conductor film is made of material capable of making electric contact with the drain electrode and the pixel electrode, which offers a wider choice of the material of the drain electrode.

The present invention also provides a method of manufacturing an electro-optic display including an active-matrix substrate having an insulative substrate and a plurality of display pixels arranged in a matrix on the insulative substrate and each having a pixel electrode electrically connected with a thin film transistor, and the manufacturing method includes the following steps (a) to (g). The step (a) is to form an inorganic insulating film entirely covering the upper surface of the insulative substrate including a drain electrode of the thin film transistor. The step (b) is to form an organic resin insulating film entirely covering the upper surface of the inorganic insulating film. The step (c) is, in a portion of the organic resin insulating film that is located above the drain electrode, to form a first opening passing through the organic resin insulating film to reach the inorganic insulating film, and a second opening sized larger than the first opening and located concentrically with the first opening, the second opening not passing completely through the organic resin insulating film, so that part of the organic resin insulating film remains under the bottom of the second opening. The step (d) is to etch the inorganic insulating film using the first opening as a mask to form a first contact hole passing through the inorganic insulating film. The step (e) is to perform an ashing process using oxygen to thin the entirety of the organic resin insulating film and to form a second contact hole passing through the organic resin insulating film by processing the second opening so that its inner walls gently slope to be shaped like a crater in cross section with its opening size increasing from the bottom toward the opening end, thereby forming a pixel-drain contact hole including the first and second contact holes communicative connected to each other. The step (f) is to form a contact conductor film filling the first contact hole at the bottom of the second contact hole and covering the inorganic insulating film exposed at the bottom of the second contact hole. The step (g) is to form the pixel electrode covering the organic resin insulating film and covering the inner wall of the pixel-drain contact hole and the contact conductor film.

According to the electro-optic display manufacturing method, in the step (e), an ashing process using oxygen is performed to thin the entire organic resin insulating film and to process the second opening to make its inner walls gently slope to be like a crater in cross section with its opening increasing in size from the bottom toward the opening end, so as to form the second contact hole passing through the organic resin insulating film. This structure prevents disconnection of the pixel electrode within the pixel-drain contact hole.

These and other objects, features, aspects and advantages of the present invention will become more apparent from the following detailed description of the present invention when taken in conjunction with the accompanying drawings.

DESCRIPTION OF THE PREFERRED EMBODIMENTS

Preferred Embodiment

<A. Structure of Device>

Figure 1:
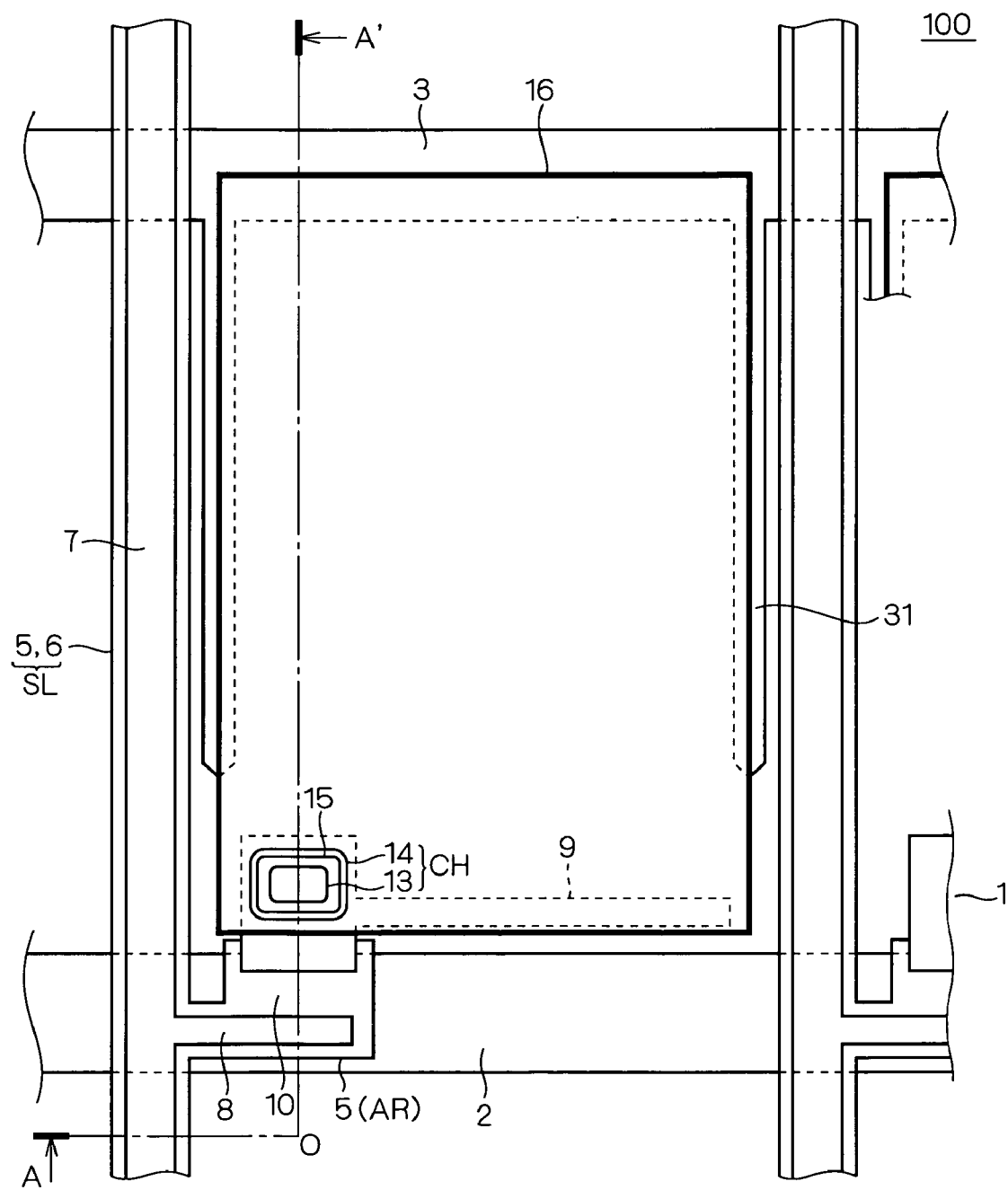
FIG. 1 is a plan view showing the structure of a TFT active-matrix substrate according to a preferred embodiment of the present invention.
Figure 2:
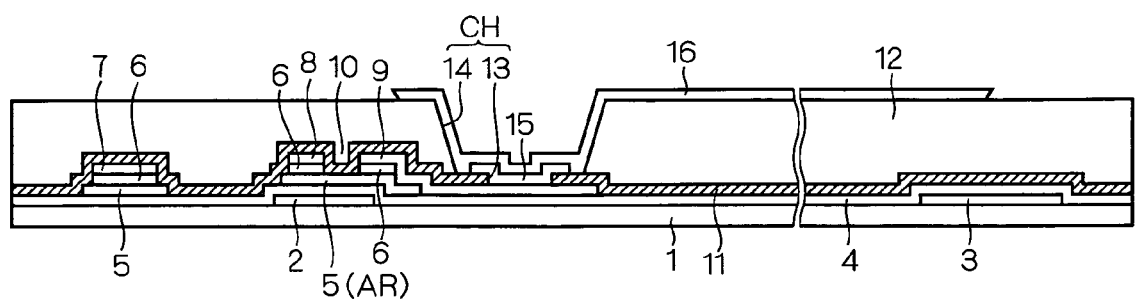
FIG. 2 is a cross-sectional view showing the structure of the TFT active-matrix substrate according to the preferred embodiment of the present invention.

In order to describe an electro-optic display according to a preferred embodiment of the present invention, FIG. 1 shows a plan view illustrating the structure of a TFT active-matrix substrate 100 for use in a transmissive-type liquid crystal display using TFTs as switching elements, and FIG. 2 shows the structure of the cross section taken along line A-O-A' in FIG. 1.

FIG. 1 is a plan view showing one pixel on the TFT active-matrix substrate 100. A plurality of such pixels are arranged in a matrix on the TFT active-matrix substrate 100.

As shown in FIG. 1, a gate wiring 2, part of which forms a gate electrode, is provided on a transparent insulative substrate 1, e.g. a glass substrate. The gate wiring 2 is formed to linearly extend in one direction on the transparent insulative substrate 1. That direction is referred to as X direction herein and the direction perpendicular to the X direction in the plane is referred to as Y direction.

An auxiliary capacitance electrode 3 is formed to extend in parallel with the gate wiring 2 at an interval, and the gate wiring 2 and the auxiliary capacitance electrode 3 define the dimension of the pixel electrode 16 in the Y direction.

The auxiliary capacitance electrode 3, which is also called an accumulation capacitance electrode, is an electrode that forms a capacitor to hold driving voltage given from the TFT connected to the pixel even after the TFT has turned off, so as to offer stable display. The auxiliary capacitance electrode 3 is structured independently of the gate wiring (gate electrode) 2. For increased capacitance, the auxiliary capacitance electrode 3 has auxiliary capacitance electrodes 31 extending in the Y direction under the two edges of the pixel electrode 16 that extend in the Y direction.

Over the gate wiring 2 and the auxiliary capacitance electrode 3, a linearly-shaped semiconductor stacked film SL is formed to intersect the gate wiring 2 and the auxiliary capacitance electrode 3 at right angles. The semiconductor stacked film SL is formed of a semiconductor film 5 and an ohmic contact film 6 stacked thereon. Plural pieces of semiconductor stacked film SL are arranged at intervals and extend in the Y direction, and adjacent pieces of semiconductor stacked film SL define the dimension of the pixel electrode 16 in the X direction. The semiconductor stacked film SL is disposed so that it does not overlap the underlying auxiliary capacitance electrodes 31.

The semiconductor stacked film SL branches at the intersection with the gate wiring 2 to form a portion that extends along the gate wiring 2, and the corresponding portion of the semiconductor film 5 forms the active region layer AR of the TFT.

On the semiconductor stacked film SL, a linearly-shaped source wiring 7 is formed along the semiconductor stacked film SL. Like the semiconductor stacked film SL, the source wiring 7 branches at the intersection with the gate wiring 2 to form a portion that extends along the gate wiring 2, and this portion forms the source electrode 8 of the TFT. The ohmic contact film 6 is present under the source electrode 8.

Also, a drain electrode 9 is formed to extend from on the active region layer AR onto the transparent insulative substrate 1 under the pixel electrode 16. The drain electrode 9 has a portion that extends in the X direction under an edge of the pixel electrode 16 that extends in the X direction.

The edges of the source electrode 8 and the source wiring 7 are receded from the corresponding parallel edges of the semiconductor film 5, and the edges of the drain electrode 9 on the active region layer AR are also receded from the corresponding parallel edges of the semiconductor film 5.

Above the active region layer AR, the source electrode 8 and the drain electrode 9 are provided at an interval, and the portion of the semiconductor film 5 between the two serves as a TFT channel 10. A pixel-drain contact hole CH reaching the pixel electrode 16 is formed above the portion of the drain electrode 9 that extends in parallel with the TFT channel 10.

Next, the cross-sectional structure of the TFT active-matrix substrate 100 will be described referring to FIG. 2.

As shown in FIG. 2, the gate electrode 2 (gate wiring 2) and the auxiliary capacitance electrode 3 are provided on the transparent insulative substrate 1, and the entire upper surface of the transparent insulative substrate 1, including the gate electrode 2 (gate wiring 2) and the auxiliary capacitance electrode 3, is covered by a first insulating film 4. The part of the first insulating film 4 that is located right over the gate electrode 2 serves as the gate insulating film.

The semiconductor film 5 provides on the first insulating film 4, and the ohmic contact film 6 provides on the semiconductor film 5. The ohmic contact film 6 is absent above the portion of the semiconductor film 5 that serves as the TFT channel 10.

While the source wiring 7 provides on the ohmic contact film 6, the upper surface of the ohmic contact film 6 on the active region layer AR is divided into a portion on which the source electrode 8 provides and a portion on which the drain electrode 9 provides, with the TFT channel I 0 interposed between them.

The drain electrode 9 extends to cover the upper surface of the ohmic contact film 6, a side of the semiconductor film 5, and the upper surface of the first insulating film 4.

A second insulating film 11, made of an inorganic insulating film, is provided to cover the entire upper surface of the transparent insulative substrate 1 including the source wiring 7, source electrode 8, and drain electrode 9, and a third insulating film 12, made of an organic resin, is provided to cover the second insulating film 11. The pixel electrode 16 is provided on the third insulating film 12.

The pixel electrode 16 is formed to also cover the inner surfaces of the pixel-drain contact hole CH that passes through the third insulating film 12 and the second insulating film 11 to reach the drain electrode 9. At the bottom of the pixel-drain contact hole CH, the pixel electrode 16 is electrically connected with the drain electrode 9 through a contact conductor film 15.

The pixel-drain contact hole CH includes a contact hole 13 (a first contact hole) that passes through the second insulating film 11 and a contact hole 14 (a second contact hole) that passes through the third insulating film 12, and the contact hole 13 and the contact hole 14 communicate with each other. The inner surfaces of the contact hole 14 (second contact hole) are gently sloped so that its dimensions gradually increase from the bottom toward the opening end, and thus its cross section is shaped like a crater.

<B. Manufacturing Method>

Next, a method of manufacturing the TFT active-matrix substrate 100 will be described referring to the cross-sectional views of FIGS. 3 to 12 showing a sequence of process steps. The cross sections of FIGS. 3 to 12 correspond to the cross section taken along the line A-O-A' of FIG. 1. FIGS. 13 to 17 are plan views of the process steps.

Figure 3:
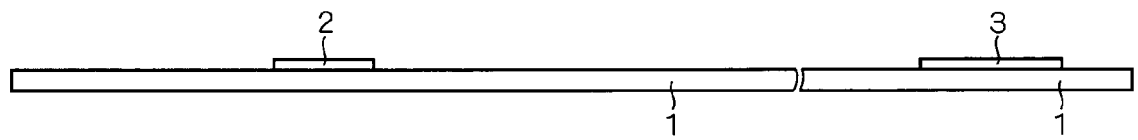
FIGS. 3 to 12 are cross-sectional views showing a sequence of process steps for manufacturing the TFT active-matrix substrate according to the preferred embodiment of the invention.

First, in the step shown in FIG. 3, a first thin metal film (not shown) is formed on the transparent insulative substrate 1, e.g., a glass substrate, and then patterned to form the gate electrode 2 (gate wiring 2) and the auxiliary capacitance electrode 3 through a first photolithography process.

Preferably, the first thin metal film is made of material having a low electric specific resistance such as Cr (chromium), and in a preferred manufacturing method using Cr as the first thin metal film, a film of Cr is formed to a thickness of 200 nm by a known sputtering method using an argon (Ar) gas.

In this case, the sputtering process uses the DC magnetron sputtering with a film formation power density of 3 W/cm$^2$ and with an Ar gas flow rate of 40 sccm.

After that, a photoresist pattern is formed in the first photolithography process and the Cr film is etched with a known solution containing ammonium cerium nitrate. The photoresist pattern is then removed to obtain the gate electrode 2 (gate wiring 2) and the auxiliary capacitance electrode 3.

Figure 13:
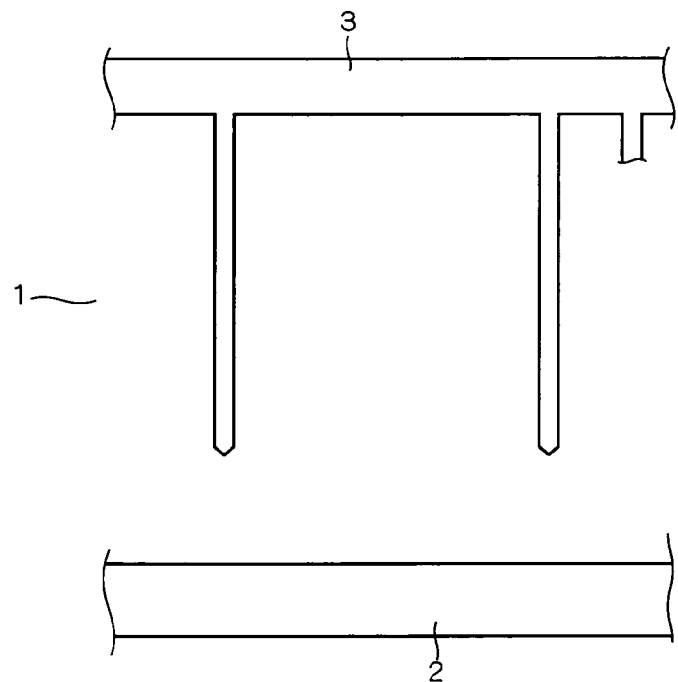
FIGS. 13 to 17 are plan views showing the process steps of manufacturing the TFT active-matrix substrate according to the preferred embodiment of the invention.

FIG. 13 shows the plan view of the gate electrode 2 (gate wiring 2) and the auxiliary capacitance electrode 3 thus formed on the transparent insulative substrate 1.

Figure 4:
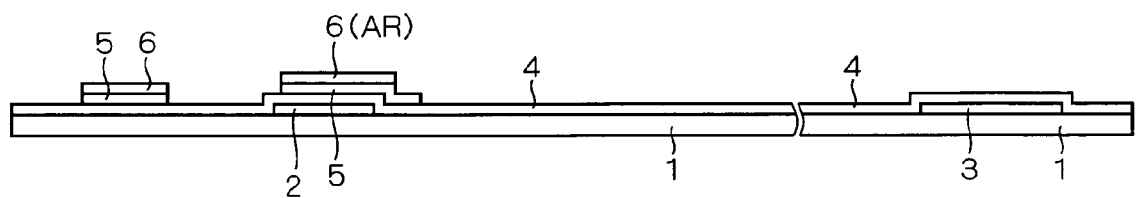

Next, in the step shown in FIG. 4, the first insulating film 4 is formed to cover the entire upper surface of the transparent insulative substrate 1 including the gate electrode 2 (gate wiring 2) and the auxiliary capacitance electrode 3. The semiconductor film 5 is then formed on the first insulating film 4, and the ohmic contact film 6 is formed further thereon.

Then, the semiconductor film 5 and the ohmic contact film 6 are patterned through a second photolithography process. The linearly-shaped semiconductor stacked film SL and the active region layer AR, where the TFT is formed, are defined together in this step.

The semiconductor film 5 and the ohmic contact film 6 are patterned so that the semiconductor film 5 and the ohmic contact film 6 are absent in the pixel display area where the pixel electrode 16 (FIG. 2) is formed later.

A preferred method of forming the first insulating film 4, the semiconductor film 5, and the ohmic contact film 6 uses chemical vapor deposition (CVD), where, first, a film of silicon nitride (SiNx: x is a positive number) is formed as the first insulating film 4 to a thickness of about 400 nm, a film of amorphous silicon (a-Si) is formed as the semiconductor film 5 to a thickness of about 200 nm, and a film of n$^+$ amorphous silicon (n$^+$ a-Si) doped with phosphorus (P) as an impurity is formed as the ohmic contact film 6 to a thickness of about 50 nm.

In the second photolithography process mentioned above, a photoresist pattern is formed and then the semiconductor film 5 (a-Si film) and the ohmic contact film 6 (n$^+$ a-Si film) are etched by a known dry-etching method using a fluorine-based gas.

Figure 14:
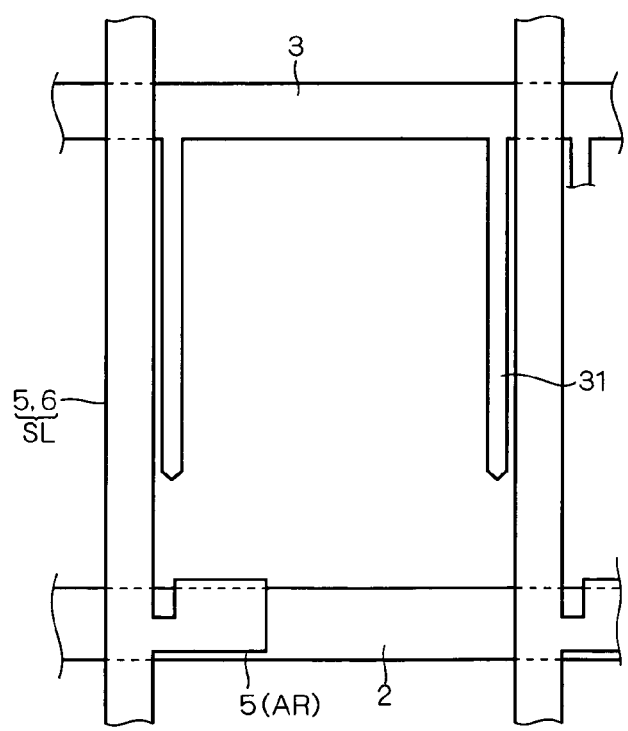

Subsequently, the photoresist pattern is removed to obtain the linearly-shaped semiconductor stacked film SL and the active region layer AR. FIG. 14 is a plan view showing the semiconductor stacked film SL and the active region layer AR overlapping with the gate electrode 2 (gate wiring 2) and the auxiliary capacitance electrode 3.

While the semiconductor film 5 is provided basically to form the active region layer AR, the semiconductor film 5 is utilized also as a constituent element of the linearly-shaped semiconductor stacked film SL in the area where the source wiring is formed later, whereby the semiconductor film 5 can be used as a redundant wiring for the source wiring to avoid the disconnection of electric signal even if the source wiring is broken.

Figure 5:
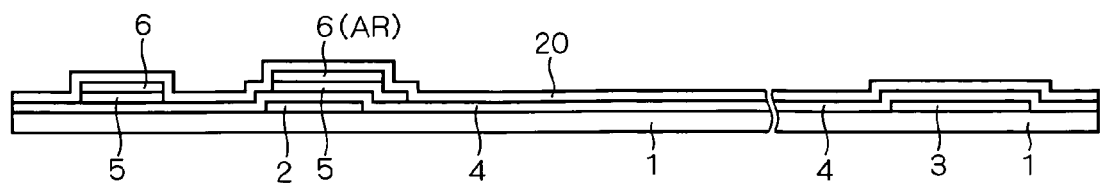

Next, in the step shown in FIG. 5, a second thin metal film 20 is formed to cover the entire upper surface of the transparent insulative substrate 1.

When Cr is used as the second thin metal film 20, a preferred method forms a Cr film to a thickness of 200 nm by a known sputtering method using an Ar gas.

In this sputtering process, DC magnetron sputtering is used with a film formation power density of 3 W/cm$^2$ and an Ar gas flow rate of 40 sccm.

Figure 6:
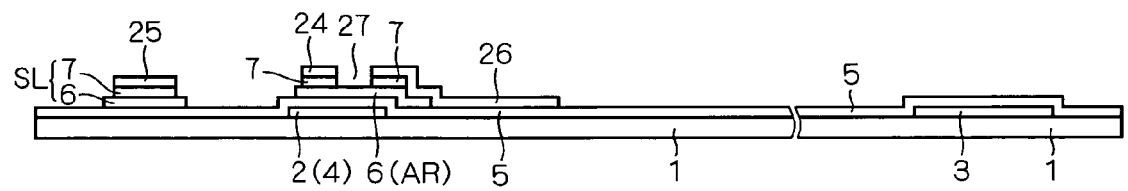

Next, a third photolithography process is performed to form a photoresist pattern, and the Cr film is etched by using a known solution containing ammonium cerium nitrate, whereby the source wiring 7, the source electrode 8, and the drain electrode 9 are obtained as shown in FIG. 6.

Then, with the photoresist pattern remaining unremoved, the portion of the ohmic contact film 6 (n$^+$ a-Si film) between the source electrode 8 and the drain electrode 9 is etched by a known dry-etching method using a fluorine-based gas, so as to form the TFT channel 10. The photoresist pattern is then removed.

Figure 15:
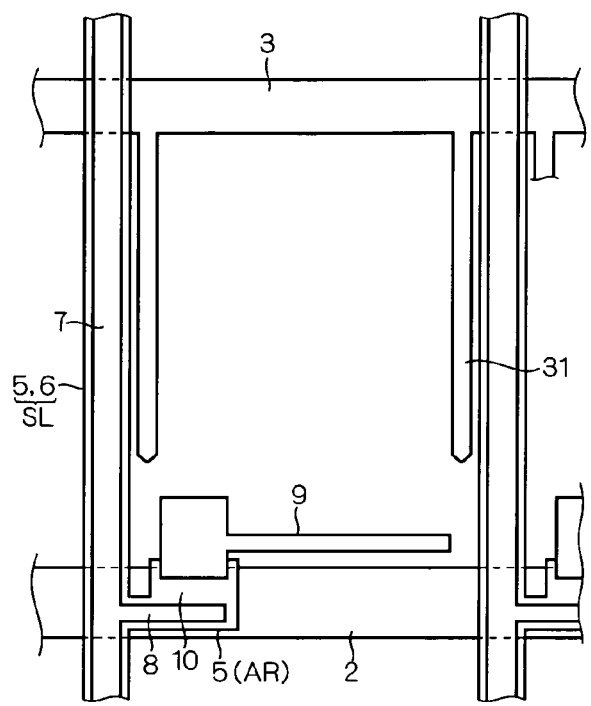

FIG. 15 shows the plan view of the source wiring 7, the source electrode 8, and the drain electrode 9. As shown in FIG. 15, the source electrode 8 has a linear shape that branches from the source wiring 7 and extends on the active region layer AR, and the drain electrode 9 has a linearly-shaped portion that extends along the gate wiring 2.

Figure 7:
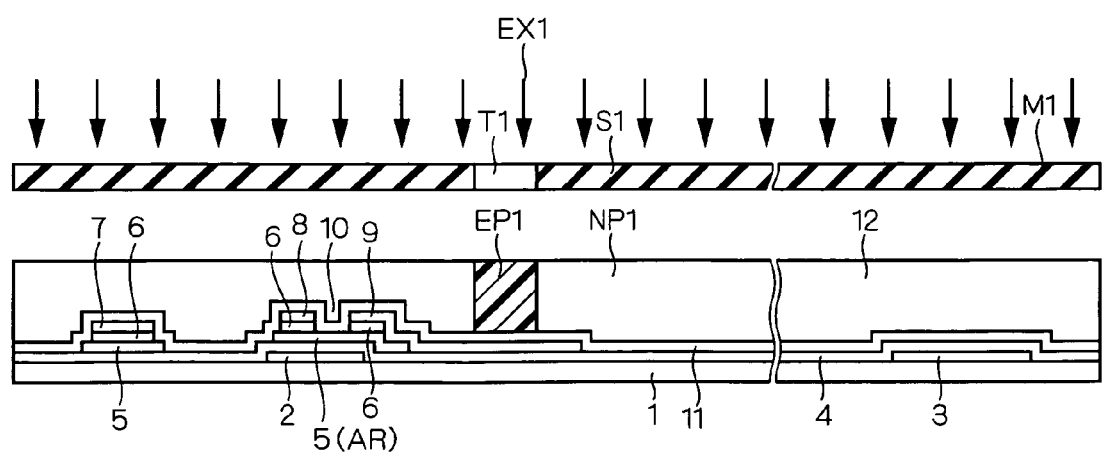

Next, as shown in FIG. 7, an inorganic insulating film is formed as the second insulating film 11 covering the entire upper surface of the transparent insulative substrate 1, and an organic resin insulating film having photosensitivity is applied and formed as the third insulating film 12.

The second insulating film 11 was formed as a film of silicon nitride (SiNx: x is a positive number) by CVD to a thickness of about 100 nm, and the third insulating film 12 was formed by applying a film of acrylic photosensitive resin, specifically, PC335 made by JSR Corporation, to a film thickness of 3.2 to 3.9 μm by spin coating.

Subsequently, a fourth photolithography process is performed as shown in FIG. 7, where, first, a first exposure is applied to the third insulating film 12 by using a photomask M1, so as to form a first exposed region EP1.

The photomask M1 has a transmissive area T1 that completely transmits the exposure light EX1 and a shield area S1 that completely blocks the exposure light EX1. Accordingly, the exposed region EP1 (a first exposed region) completely exposed to the first exposure and an unexposed region NP1 not exposed at all are formed in the third insulating film 12.

Figure 8:
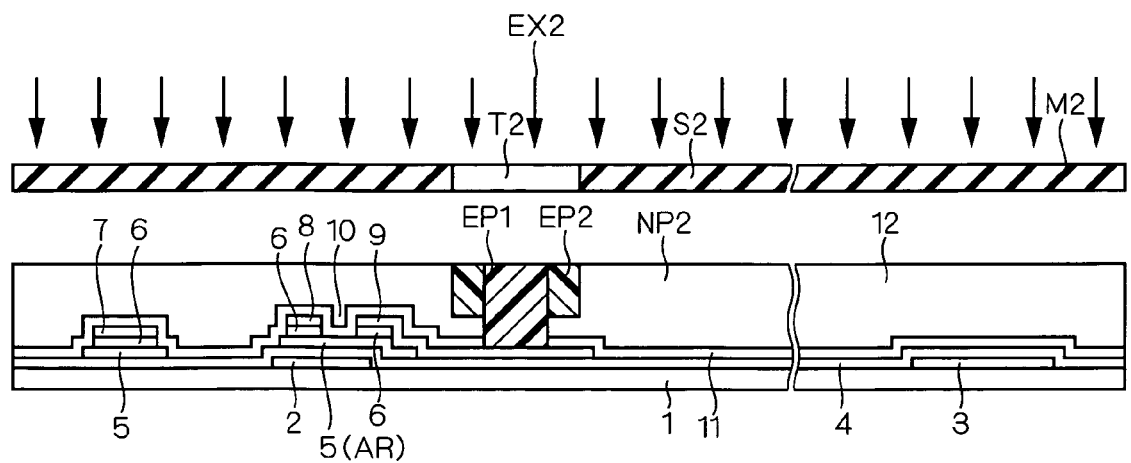

Next, in the step shown in FIG. 8, a second exposure is applied to the third insulating film 12 by using a photomask M2 to form an exposed region EP2.

The photomask M2 has a transmissive area T2 that completely transmits the exposure light EX2 and a shield area S2 that completely blocks the exposure light EX2. Accordingly, the exposed region EP2 (a second exposed region) exposed to the second exposure and an unexposed region NP2 not exposed at all are formed in the third insulating film 12.

The second exposure is a so-called half exposure, and the third insulating film 12 is not completely exposed but is exposed to the exposure light EX2 that has an intensity of about 20 to 40% of that of the first exposure so that the exposed region remains as a thin film after developed. The exposed region EP2 is thus formed as a half exposed region.

While the half exposed region EP2 is overlapped concentrically with the exposed region EP1, the half exposed region EP2 has a larger area.

Figure 9:
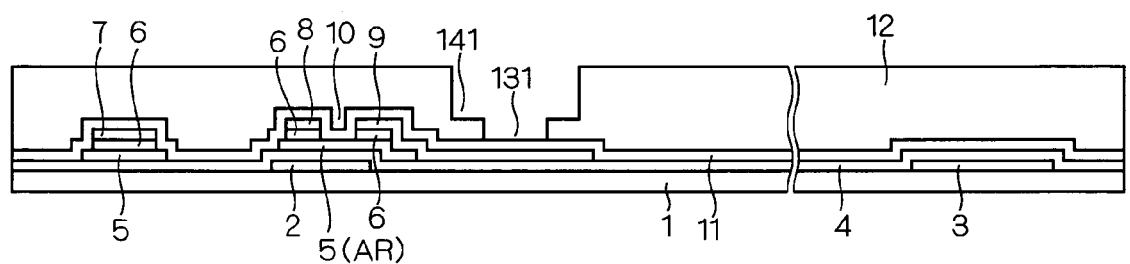
Figure 16:
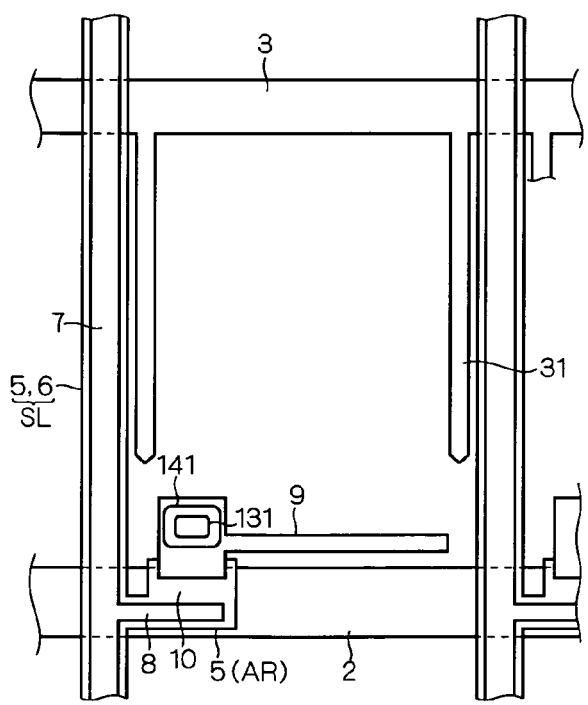

Subsequently, in the step shown in FIG. 9, a development is performed with a known organic alkaline developer, whereby an opening 131 (a first opening) passing through the third insulating film 12 to reach the second insulating film 11 is formed in communicative connection with an opening 141 (a second opening) that does not penetrate completely through the third insulating film 12 but allows the third insulating film 12 to remain with a thickness of about 0.8 μm in the bottom. FIG. 16 is a plan view showing the opening 131 and the opening 141 thus formed.

In this way, the half exposure process enables the formation of the complicatedly-shaped opening including the opening 131 and the opening 141 through a single photolithography process, which simplifies the manufacturing process.

The fourth photolithography process described above has shown an example in which the exposed region EP1 and the half exposed region EP2 are formed in the third insulating film 12 by a two-step exposure process including the first exposure and the second exposure. However, this is intended only to be illustrative and the exposed region EP1 and the half exposed region EP2 may be formed by a single-step exposure process.

That is, the third insulating film 12 may be exposed by using a photomask that has a half transmissive area allowing transmission of about 20 to 40% of exposure light in the area corresponding to the half exposed region EP2 and a full transmissive area allowing complete transmission of the exposure light in the area corresponding to the exposed region EP1.

The half transmissive area may be formed of a filter film that reduces the amount of transmission of the exposure light to about 20 to 40%. Alternatively, the half transmissive area may be formed of a pattern of slits utilizing diffraction of light. With a photomask having such a half transmissive area and a full transmissive area, the exposed region EP1 and the half exposed region EP2 as shown in FIG. 8 can be formed through a single exposure, which simplifies the photolithography process and enhances manufacturing efficiency.

Figure 10:
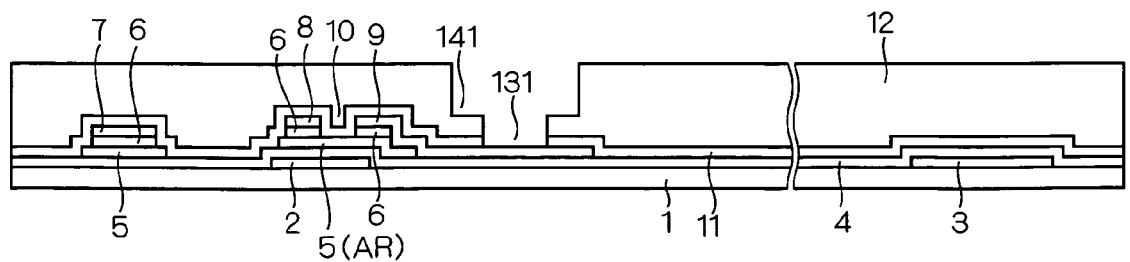

Next, in the step shown in FIG. 10, the second insulating film 11 exposed at the bottom of the opening 131 is removed by a known dry-etching method using a fluorine-based gas, thereby forming the contact hole 13 that reaches the drain electrode 9.

Figure 11:
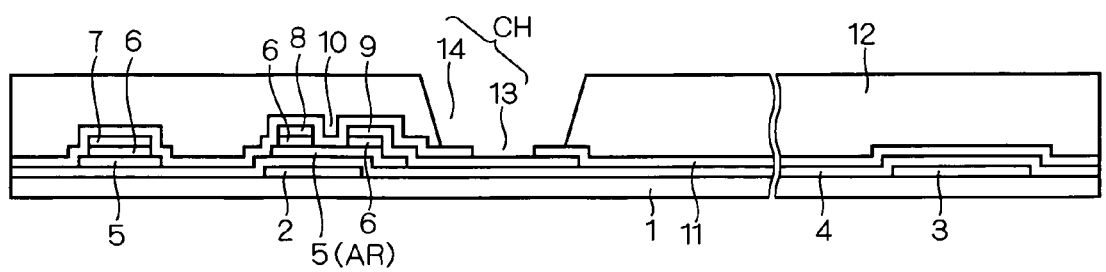

Next, in the step shown in FIG. 11, a known ashing process using an oxygen gas is performed to thin the entirety of the third insulating film 12 and to process the opening 141 so that its cross section is shaped like a crater, whereby the step between the opening 131 and the opening 141 is removed and the contact hole 14 is obtained. The second insulating film 11 is exposed along the edges of the bottom of the contact hole 14, and the drain electrode 9 is exposed in the central area corresponding to the contact hole 13, and the contact holes 13 and 14 thus form the pixel-drain contact hole CH.

Figure 12:
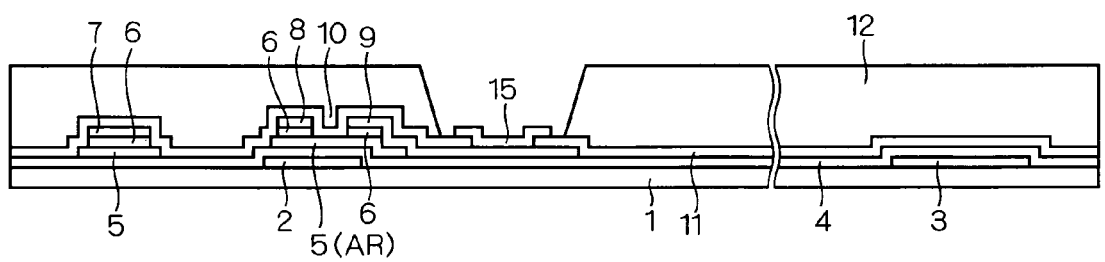
Figure 17:
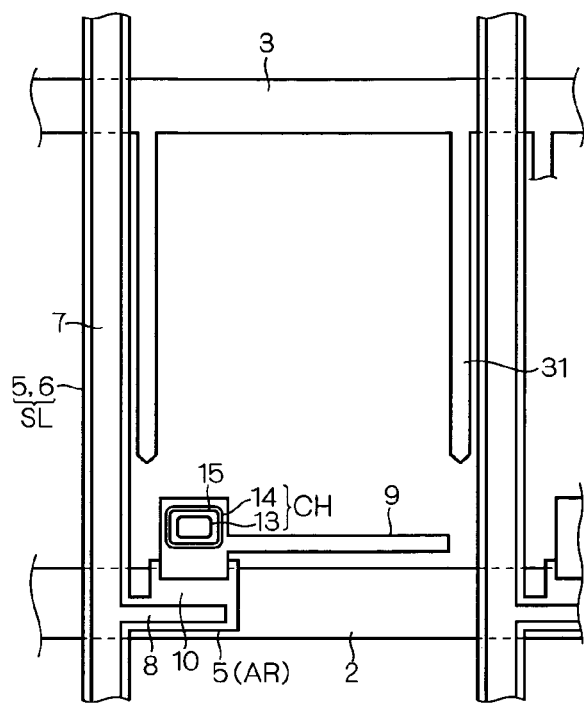

Next, in the step shown in FIG. 12, a third thin metal film (not shown) is formed all over the third insulating film 12, including the inner surfaces of the pixel-drain contact hole CH, and then the contact conductor film 15 is patterned in the bottom of the pixel-drain contact hole CH through a fifth photolithography process. FIG. 17 is a plan view showing the contact conductor film 15 formed in the bottom of the pixel-drain contact hole CH.

In a preferred method of forming the contact conductor film 15, a film of Cr, having higher ductility than transparent conductive film such as ITO, is formed by sputtering to a thickness of about 100 nm, a photoresist pattern is formed in the fifth photolithography process mentioned above, and the Cr film is etched with a known solution containing ammonium cerium nitrate to obtain the contact conductor film 15.

The contact conductor film 15 is patterned so that it completely fills the contact hole 13 to come in close contact with the drain electrode 9, and so that the edges of the contact conductor film 15 cover the second insulating film 11 exposed at the bottom of the contact hole 14, with the edges of the contact conductor film 15 located within the bottom of the contact hole 14.

Finally, a thin transparent conductive film is formed to cover the entire surface of the third insulating film 12 including the inner surfaces of the pixel-drain contact hole CH, and then the thin transparent conductive film is patterned through a sixth photolithography process to form the pixel electrode 16 that is electrically connected with the underlying drain electrode 9 through the pixel-drain contact hole CH. The TFT active-matrix substrate 100 having the cross-sectional structure as shown in FIG. 2 is thus obtained.

More specifically, an ITO film, containing a mixture of indium oxide ($In_2O_3$) and tin oxide ($SnO_2$), is formed to a thickness of 100 nm by a known sputtering method, and a photoresist pattern is formed in the sixth photolithography process so that the area for the formation of the pixel electrode 16 is covered by the photoresist. Then, the exposed portion of the ITO film is removed by a known wet-etching method using a solution containing hydrochloric acid +nitric acid to form the pixel electrode 16.

<C. Characteristic Functions and Effects>

According to the preferred embodiment of the present invention, the contact conductor film 15 is made of a thin metal film having higher ductility than transparent conductive films such as ITO, and is formed to completely fill the contact hole 13 in the bottom of the pixel-drain contact hole CH. This prevents formation of cracks at the edges of the periphery of the contact hole 13.

Also, the second insulating film 11 made of inorganic insulating film lies under the edges of the contact conductor film 15, which prevents penetration of the ammonium cerium nitrate solution used to etch the contact conductor film 15. This prevents the edges of the contact conductor film 15 from being reversely tapered in cross section, thus preventing disconnection of the pixel electrode 16 in the vicinity of the edges of the contact conductor film 15.

Furthermore, the opening 141 formed in the third insulating film 12 is processed by ashing so that it is shaped like a crater in cross section, whereby the step between the opening 131 and the opening 141 is removed to obtain the contact hole 14 having gently sloped surfaces. This prevents disconnection of the pixel electrode 16 within the pixel-drain contact hole CH.

In this way, it is possible to certainly prevent loss of electric connection between the pixel electrode 16 and the drain electrode 9, which makes it possible to prevent point defects in the electro-optic display and enables the manufacture of reliable electro-optic displays with a high yield.

Also, electrically connecting the pixel electrode 16 and the drain electrode 9 through the contact conductor film 15 reduces the resistance of connection, which enables the manufacture of an electro-optic display of high display quality.

Particularly, even when the drain electrode 9 is made of a thin film of Al-based metal that cannot make electric contact with transparent conductive film like ITO or IZO, the pixel electrode 16 and the drain electrode 9 can be electrically connected by forming the contact conductor film 15 of metal such as Cr, Mo (molybdenum), T1 (titanium), or W (tungsten) that allows good electric contact with both of the Al-based thin metal film and the transparent conductive film. This offers a wider choice of the material of the drain electrode.

<D. Modifications>

In the example of the preferred embodiment above, the second insulating film 11 is formed through the formation of an inorganic insulating film, the third insulating film 12 is then formed through the application and formation of an organic resin insulating film having photosensitivity, the openings 131 and 141 are formed in the third insulating film 12 through a single photolithography process, and then the pixel-drain contact hole CH, which is shaped like a crater in cross section, is formed by dry-etching and ashing so that the drain electrode 9 is exposed at the bottom thereof. However, the contact hole passing through the second insulating film 11 and the contact hole passing through the third insulating film 12 may be formed in separate photolithography process steps.

Figure 18:
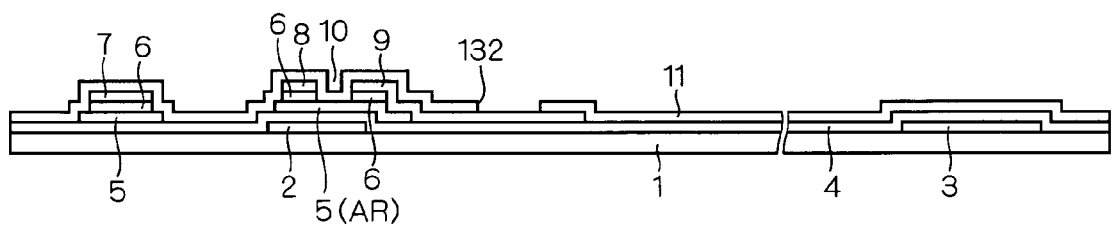
FIGS. 18 and 19 are cross-sectional views showing a modification of the process of manufacturing the TFT active-matrix substrate according to the preferred embodiment of the invention.

FIG. 18 is a cross-sectional view in which, after the step of FIG. 6, an inorganic insulating film is formed as the second insulating film 11 over the entire surface of the transparent insulative substrate 1 and a contact hole 132 (a first contact hole) passing through the second insulating film 11 is formed through a photolithography process.

Figure 19:
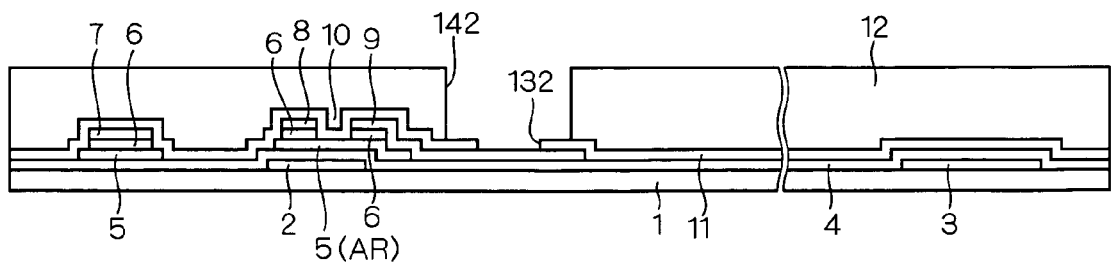

After that, an organic resin insulating film having photosensitivity is applied and formed as the third insulating film 12 covering the entire surface of the transparent insulative substrate 1, and as shown in FIG. 19, a contact hole 142 (a second contact hole) passing through the third insulating film 12 is formed through a photolithography process.

Adopting this method allows the contact hole 132 and the contact hole 142 to be patterned into arbitrary shapes.

Figure 20:
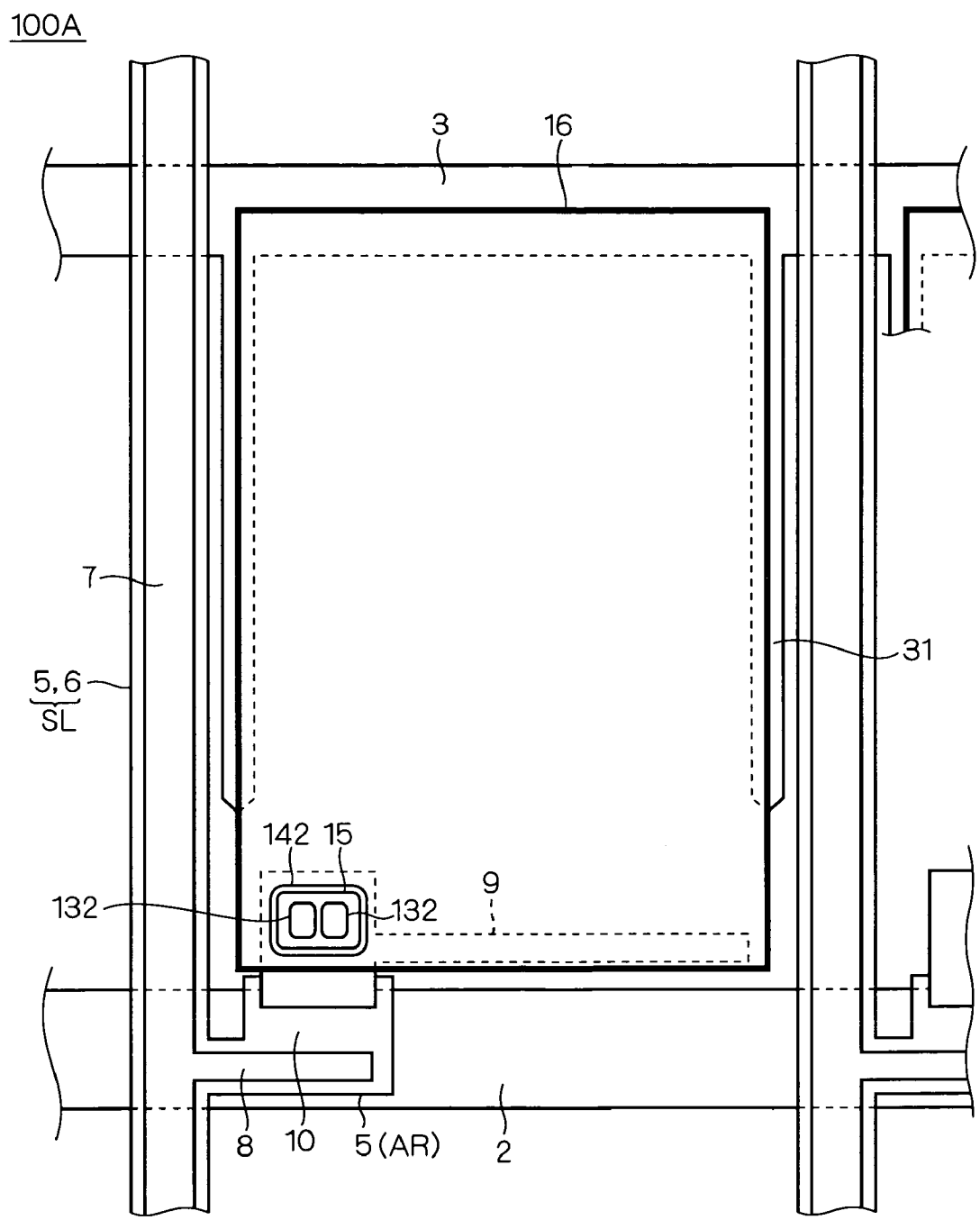
FIGS. 20 and 21 are plan views showing the structures of modifications of the TFT active-matrix substrate of the preferred embodiment of the invention.
Figure 21:
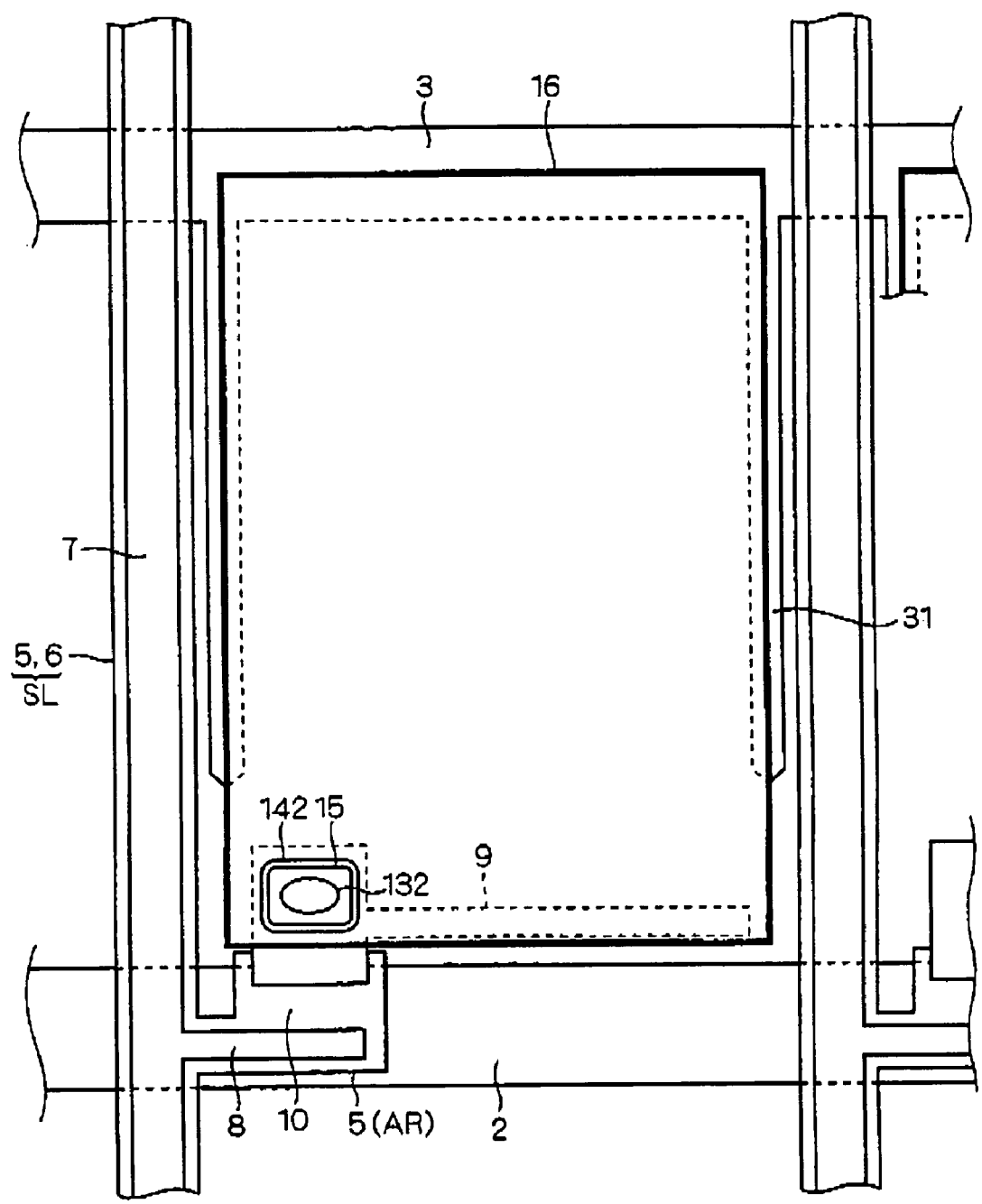

FIGS. 20 and 21 are plan views showing examples of the contact hole 132 and the contact hole 142 formed by separate photolithography process steps.

FIG. 20 is a plan of a TFT active-matrix substrate 100A having two contact holes 132 arranged alongside each other. The same components as those of the TFT active-matrix substrate 100 of FIG. 1 are shown at the same reference characters and are not described here again.

With this structure, when one of the two contact holes 132 suffers a trouble during manufacturing process and the electric connection between the drain electrode 9 and the contact conductor film 15 is broken, for example, the remaining contact hole 132 still works, which prevents reduction of yield due to failure of contact.

FIG. 21 is a plan of a TFT active-matrix substrate 100B having a contact hole 132 formed in a round or oval shape in plan view. The same components as those of the TFT active-matrix substrate 100 of FIG. 1 are shown at the same reference characters and are not described here again.

This structure scatters and alleviates the stress to the contact conductor film 15 at the stepped portion of the contact hole 132, which prevents the contact conductor film 15 from cracking and disconnecting.

Needless to say, the shape of the contact hole 132 in plan view is not limited to round or oval shape, but it may be formed in polygonal shape or two or more contact holes 132 may be arranged alongside.

<E. Other Applications>

The preferred embodiment above has shown an application of the present invention to an active-matrix substrate for use in a liquid crystal display of light transmissive type, but the application of the present invention is not limited to this example. The present invention is applicable to any electro-optic displays that are constructed similarly to that of the preferred embodiment.

While the invention has been described in detail, the foregoing description is in all aspects illustrative and not restrictive. It is understood that numerous other modifications and variations can be devised without departing from the scope of the invention.

What is claimed is:

1. An electro-optic display comprising an active-matrix substrate, said active-matrix substrate comprising an insulative substrate and a plurality of display pixels arranged in a matrix on said insulative substrate and each having a pixel electrode electrically connected with a thin film transistor, wherein said active-matrix substrate further comprises, in each said display pixel, an inorganic insulating film that is directly above substantially an entire upper surface of said insulative substrate, said inorganic insulating film being directly above a drain electrode of said thin film transistor;

an organic resin insulating film that is directly above substantially an entire upper surface of said inorganic insulating film;

a pixel-drain contact hole that passes through said inorganic insulating film and said organic resin insulating film to reach said drain electrode; and a contact conductor film that is provided at a bottom of said pixel-drain contact hole and is in contact with said drain electrode but is not in contact with said organic resin insulating film, said pixel electrode being disposed to cover an upper surface of said organic resin insulating film and also to cover an inner wall of said pixel-drain contact hole and said contact conductor film, an edge portion of said contact conductor film being formed so as to be in contact with said inorganic insulating film exposed at the bottom of said pixel-drain contact hole.

2. The electro-optic display according to claim 1, wherein said pixel-drain contact hole comprises a first contact hole passing through said inorganic insulating film and a second contact hole passing through said organic resin insulating film, said first contact hole and said second contact hole communicative connecting with each other to form said pixel-drain contact hole, said second contact hole has an opening sized larger than an opening of said first contact hole, the bottom of said pixel-drain contact hole corresponds to a bottom of said first contact hole, and said contact conductor film fills said first contact hole and covers said inorganic insulating film exposed at the bottom of said second contact hole.

3. The electro-optic display according to claim 2, wherein said second contact hole has its inner walls gently sloped to be shaped like a crater in cross section with its opening size increasing from the bottom toward its opening end.

4. The electro-optic display according to claim 1, wherein said contact conductor film comprises a film of a metal selected from the group consisting of Cr (chromium), Mo (molybdenum), Ti (titanium), and W (tungsten).

* * * * *